United States Patent

[11] 3,624,454

[72] Inventors Allen R. Adkinson
Sharpsville;
Richard G. Carter, Sharpsville; Glen E. Harland, Jr., Kokomo, all of Ind.

[21] Appl. No. 857,770
[22] Filed Sept. 15, 1969
[45] Patented Nov. 30, 1971
[73] Assignee General Motors Corporation
Detroit, Mich.

[54] MESA-TYPE SEMICONDUCTOR DEVICE
9 Claims, 8 Drawing Figs.

[52] U.S. Cl. .......... 317/101 A, 317/235, 307/315
[51] Int. Cl. .......... H01l 19/00
[50] Field of Search .......... 317/101 A, 235 (22.1); 307/315

[56] References Cited
UNITED STATES PATENTS

| | | | |
|---|---|---|---|
| 2,663,806 | 12/1953 | Darlington | 317/101 A UX |
| 3,100,276 | 8/1963 | Meyer | 317/101 A UX |
| 3,209,214 | 9/1965 | Murphy et al. | 307/315 X |
| 3,210,617 | 10/1965 | Kruper | 307/315 X |
| 3,237,062 | 2/1966 | Murphy | 317/234 (22.1) UX |

*Primary Examiner*—David Smith, Jr.
*Attorneys*—William S. Pettigrew and Robert J. Wallace

ABSTRACT: A mesa-type semiconductor device having integrally formed circuit components thereon including resistors. One form of this device includes, on a monolithic chip or wafer, a mesa-type Darlington amplifier having etch moats. Bleeder resistors are integrally formed between the etch moats eliminating several wire bonds which would be necessary to interconnect the resistors with the active regions of the wafer.

INVENTORS
Allen R. Adkinson,
Richard G. Carter &
BY Glen E. Harland, Jr.
L. J. Wallace
ATTORNEY INVENTORS
Allen R. Adkinson,
Richard G. Carter &
Glen E. Harland, Jr.
BY
R. J. Wallace
ATTORNEY

MESA-TYPE SEMICONDUCTOR DEVICE

BACKGROUND OF THE INVENTION

This invention relates to semiconductor devices and more particularly to mesa-type semiconductor devices.

The integrated circuit technology can be used to produce in high-volume, low-cost planar-type semiconductor devices. For example, state-of-the-art integrated circuit technology can be utilized to produce a high current gain, low-cost planar-type Darlington amplifier circuit device on a monolithic chip of semiconductor. Resistors, capacitors and diodes can be formed integrally on the same semiconductor chip. This eliminates a number of wire-bonding operations which would be necessary to interconnect components. This interconnecting of components can be costly and time consuming to perform. However, planar devices generally do not possess high-energy capability and are not commonly used in high-current applications. Moreover, if one requires a planar-type high-voltage transistor, about 100 volts, to have a low collector-emitter saturation voltage of about 1 volt at about 5 amperes, epitaxy techniques or the like would ordinarily be used. For example, one could grow a thin epitaxial layer, about 1 mil thick, onto a highly doped, about 0.01 ohm centimeter, collector substrate. The low resistivity of the substrate would eliminate most of the collector resistance, and one could obtain a very low collector-emitter saturation voltage at high currents. However, epitaxial wafers are more expensive, being about 5 times the cost of a homogeneous wafer. Furthermore, an epitaxial wafer would not generally increase the high-energy capability of the device.

On the other hand, mesa-type devices can readily be constructed to possess high-energy capability. Moreover, mesa-type devices having low-collector-emitter saturation voltage at high current can be produced from homogeneous material. A mesa-type semiconductor device, as herein characterized, is one in which the active regions are not coplanar at a major surface of the semiconductor device. This means, of course, that the collector-base and base-emitter PN-junctions do not terminate at the same surface of the device. An etch moat is often needed to electrically isolate circuit components of this type of device from each other. Accordingly, such structures do not readily lend themselves to conventional integrated circuit technology. For example, in order to manufacture a monolithic mesa-type Darlington amplifier, conventional prior art techniques would require that a separate jumper wire be connected over the moat from the emitter of the driver stage or input transistor to the base of the output transistor.

Furthermore, if the Darlington amplifier circuit is to be used in a high-temperature environment, diode leakage, particularly base-emitter junction leakage, could constitute a major problem and bleeder resistors would ordinarily be used. For example, in a high-temperature application, such as one finds in under-hood-automobile applications, bleeder resistors are generally used to drain off the diode leakage current. An illustrative application of this type of device would be as the output amplifier in an automotive voltage regulator. If one used a conventional prior art mesa-type Darlington amplifier circuit for this type of application, several jumper wires interconnecting the bleeder resistors with the active areas of the semiconductor chip would also be necessary. Consequently, this type of structure ordinarily does not readily lend itself to low-cost, high-volume manufacturing.

BRIEF SUMMARY

Accordingly, it is a principal object of this invention to provide a mesa-type integrated circuit semiconductor device.

Another principal object of this invention is to provide a mesa-type integrated circuit Darlington amplifier.

Still another object of this invention is to provide a mesa-type Darlington amplifier having integrally formed bleeder resistors.

Yet another object of this invention is to provide a mesa-type Darlington amplifier having integrally formed bleeder resistors which can be readily manufactured using low-cost, high-volume manufacturing techniques.

Other objects, features, and advantages of this invention will become more apparent from the following description of the preferred example and from the drawings in which.

DETAILED DESCRIPTION OF PREFERRED EMBODIMENT

Figure 1:
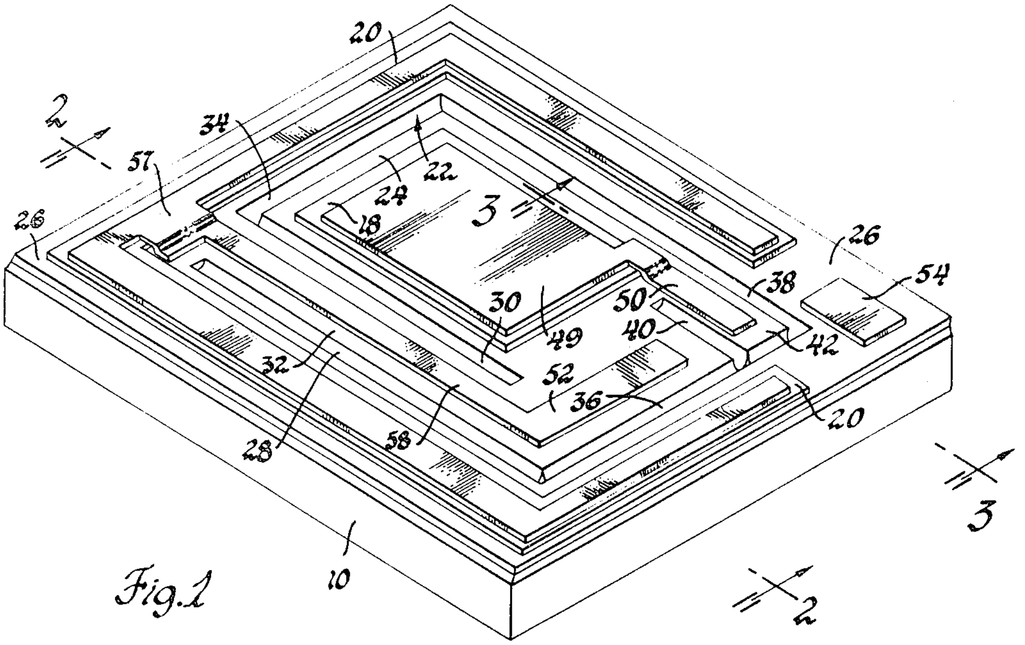
FIG. 1 is a perspective view of a semiconductor device made in accordance with the presently preferred embodiment of this invention.
Figure 2:
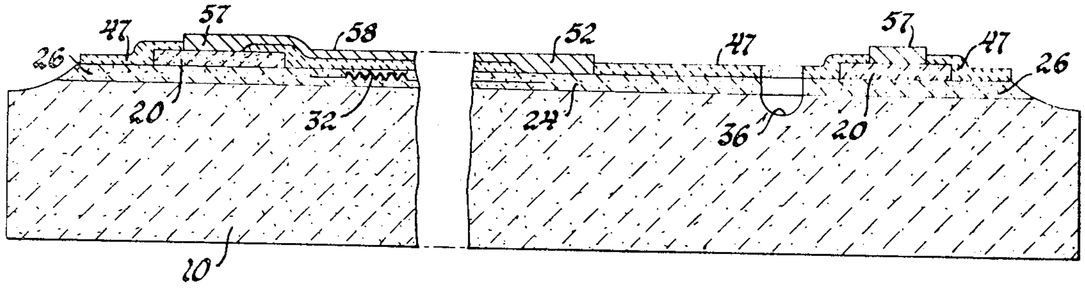
FIG. 2 is a sectional view taken along the line 2—2 of FIG. 1.
Figures 3, 4:
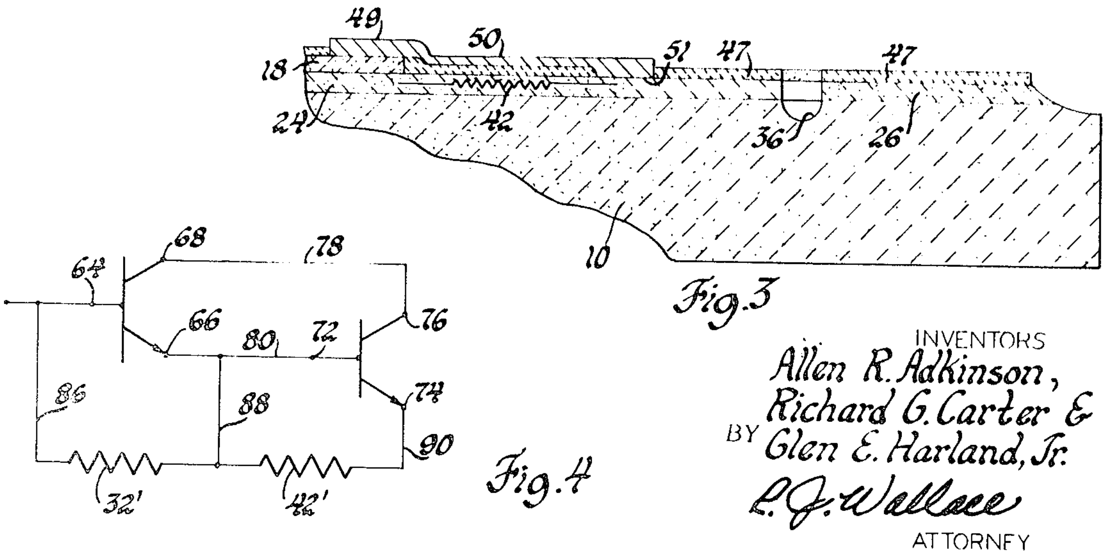
FIG. 3 is a sectional view taken along the line 3—3 of FIG. 1.
FIG. 4 is a diagrammatic representation of the semiconductor device made in accordance with the presently preferred embodiment of this invention.

Turning now to the figures, FIGS. 1–3 show a mesa-type two transistor Darlington amplifier circuit including bleeder resistors integrally formed on a N-type silicon wafer 10. The wafer 10 functions as a common collector substrate for the two transistor amplifier. It has major surface dimensions of about 175×175 mils. A P-type base region or layer is formed on one of the major surfaces of the wafer. The collector substrate or wafer 10 has a resistivity of about 1 ohm centimeter and is about 8.5 mils thick. Base region is a diffusion zone about 1.5 mils thick and has a sheet resistivity of about 50 ohms per square on its surface.

This embodiment of the invention has an input transistor formed generally about the periphery of the substrate and an output transistor formed generally centrally thereon. Thus, the transistors are generally concentric to each other, and the collector-base PN-junction of the input transistor is exposed at the edges of the wafer. The output transistor includes a generally rectangular-shaped N-type upstanding, or mesa, emitter region 18 centrally disposed on the base region. The input transistor includes a striplike N-type upstanding, or mesa, emitter region 20 disposed on the base region. Emitter mesa 20 which is spaced from the edge of the base region about 2 mils extends substantially around the periphery of the chip being discontinuous at one corner. Each emitter mesa region extends about 0.4 mils above the base region and each has a resistivity of greater than about 0.5 ohms per square.

A discontinuous spirallike isolation etch moat 22 noncontiguously surrounds central emitter mesa 18 in a mazelike or rectangularlike fashion, being spaced therefrom by an output base section 24 of the base region. An input base section 26 of the base region completely surrounds outer emitter mesa 20 and spaces it from moat 22 and the perimeter of the wafer. Moat 22 which is about 3 mils wide extends through the base region into collector substrate 10. The collector-base PN-junction of the output transistor is exposed within moat 22.

Moat 22 includes six segments. Two of these segments labeled 28 and 30 respectively are parallel to each other, and define an elongated integral passageway 32 within the base region between output base section 24 and input base section 26. Passageway 32 is about 100 mils in length and about 9 mils wide. Segments 34. 36 and 38 connect with opposite ends of segments 28 and 30 to otherwise isolate base sections 24 and 26 from each other. In addition, a relatively short moat segment or projection 40 extends a short distance into base section 24 generally perpendicularly from segment 36 adjacent segment 38. Moat segment 40 cooperates with segments 36 and 38 to define a short elongated strip 42 of the base region enclosed on three sides by etch moats. Strip 42 which is about 30 mils in length and about 8 mils wide has an end contiguous to base region 24 and a free end.

The surface of the base region as well as the top and sides chip both emitter mesas are covered with a layer 47 of silicon oxide. An evaporated aluminum contact or coating includes generally rectangular segments 49 and 50, engaging emitter mesa 18 and the free end 51 respectively through holes in layer 47. Rectangular segment 50 generally overlies elongated strip 42 on layer 47. An elongated evaporated aluminum contact or coating 52 engages output base section 24, also through a hole in layer 47. It extends generally parallel to and adjacent segment 36, terminating contiguous to passageway 32. Input base section 26 has an evaporated aluminum contact 54 engaging it in a corner of the chip adjacent the free ends of peripheral emitter mesa 20 through a hole in layer 47. An evaporated aluminum contact or coating has a striplike segment 57 engaging emitter mesa 20, substantially about the periphery of the chip similarly through a hole in layer 47, and an over-the-oxide strip 58 electrically interconnecting segment 57 with contact 52. Strip 58 generally overlies passageway 32 on layer 47.

Turning now primarily to FIG. 4 which generally shows the herein described preferred embodiment in diagrammatic fashion. The diagram includes an input transistor having a base terminal 64, an emitter terminal 66, and a collector terminal 68. An output transistor is shown having a base terminal 72, an emitter terminal 74, and a collector terminal 76. The transistors are connected in a common collector mode with collector terminal 68 being connected to collector terminal 76 by a lead 78. Emitter terminal 66 of the input transistor is drivingly connected to base terminal 72 of the output transistor by a lead 80. Bleeder resistors 32' and 42' are connected across the base-emitter terminals of the input and output resistors respectively by leads, 86, 88 and 90.

As can be easily visualized, the input transistor corresponds to the transistor formed by emitter region 20, base section 26 and the peripheral portion of collector substrate 10. The output transistor corresponds to a transistor formed by emitter region 18, base section 24 and the central portion of collector substrate 10. Bleeder resistor 32' generally corresponds to the resistance provided by passageway 32 of base region 12. Bleeder resistor 42° generally corresponds to the resistance provided by elongated strip 42 of the base region. Lead 80 corresponds to the over-the-oxide aluminum strip 58. Lead 90 corresponds to over-the-oxide aluminum rectangular segment 50.

Passageway 32 resistively and integrally interconnects base sections 24 and 26. This is represented diagrammatically by leads 86, 88 and a portion of lead 80. Elongated relative strip 42 is connected to emitter mesa 18 at the free end of strip 42 by aluminum rectangular segment or strip lead 50. It is also contiguous to base section 24 at its other end. This is represented schematically by leads 90, 88 and a portion of lead 80. Lead 78 represents the integral interconnection between the collector substrate underneath the peripheral emitter region 20 and the collector substrate underlying the centrally disposed emitter mesa 18.

It should be noted that while the interconnecting leads are all displayed diagrammatically as essentially low-resistance conductors, this is not exactly the case. For example, the resistance provided by passageway 32 is integrally associated with the input and output base sections and consequently, interconnecting lead are unnecessary. Also, the resistance provided by strip 42 is integrally associated with the output base section and consequently, only one interconnecting lead or conductive strip, strip 50 is necessary. Moreover, the bleeder resistors are shown schematically interconnected to each other by a conductor lead. In fact, however, they are integrally associated respectively with opposite sides of the output base section. Of course, conductive strips or leads 50 and 58 which correspond to leads 90 and 80 are low-resistance aluminum conductors. Leads 50 and 58 are thick enough to maintain low-resistance continuous connection notwithstanding the undulations in layer 47 of silicon oxide particularly at base-emitter intersections.

It should also be noted that the resistance provided by passageway 32 and strip 42 is their resistivity in ohms per square multiplied by the number of squares contained thereon. The number of squares, of course, is determined by dividing the length measurement by the width measurement. For example, in the herein described presently preferred embodiment, in the 32 which has a length measurement of about 100 mils is divided by its width measurement, about 9 mils, to obtain about 11 squares. This number is multiplied by the sheet resistivity, about 50 ohms per square, to determine the resistance provided which is about 550 ohms. Strip 42, on the other hand, has a length measurement of about 30 mils and a width measurement of about 8 mils, or about 3.75 squares. The resistance provided by strip 42 is, then about 187 ohms.

Figure 5:
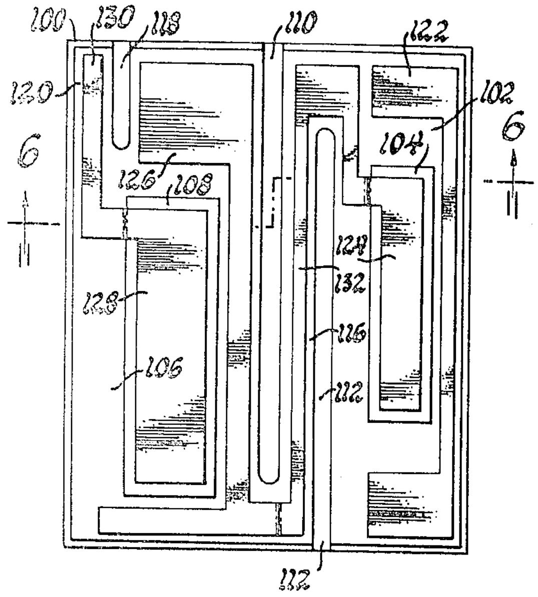
FIG. 5 is a plan view of a second embodiment of a semiconductor device made in accordance with this invention.
Figure 6:
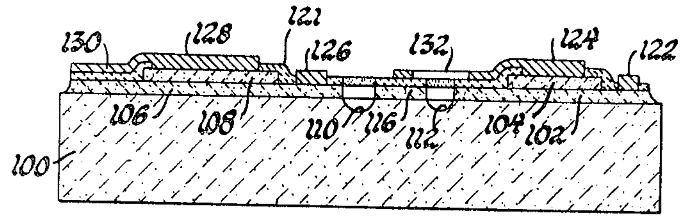
FIG. 6 is a sectional view taken along line 6—6 of FIG. 5.

Referring now primarily to FIGS. 5 and 6, another embodiment of this invention is shown including a silicon semiconductor wafer 100 having mesa-type input and output transistors on opposite ends of the same major surface of the chip. The input transistor includes an input base section 102 and an upstanding input emitter mesa 104 thereon. The output transistor includes an output base section 106 and an upstanding output emitter mesa 108 thereon.

A pair of spaced apart generally parallel etch moats 110 and 112 extend substantially across chip, about 90 percent across, from opposite sides spacing apart the input and output transistors. Etch moats 110 and 112 define an elongated passageway 116 of the base region which is contiguous to input base section 102, and the output section 106 on opposite ends of the wafer. This forms an integral resistive interconnection between input base section 102 and output base section 106.

A second resistor is formed contiguously to output base section 106 by a third etch moat 118 adjacent one edge of the chip on the outer transistor ends. Moat 118 extends about one-fourth the distance across the wafer cooperating with the adjacent edge of the wafer to define a resistive strip 120 of base material contiguous to output base section 106.

A protective refractory coating 121 of silicon oxide is formed over the emitter regions and base sections of the input and output transistors. Also a common and widely known passivating substance protects the exposed collector-base PN-junction. Evaporated aluminum contacts 122 and 124 respectively engage base section 102 and emitter mesa 104 through appropriate openings in the refractory coating. Similarly, evaporated aluminum contacts 126 and 128 respectively engage base section 106 and emitter mesa 108. An evaporated aluminum contact 130 engages the end of the resistive strip 120 spaced from output base section 106 interconnecting with contact 128 on section 106.

An over-the-oxide aluminum lead 132 generally overlying passageway 116 spaced therefrom by oxide coating 121 interconnects input emitter region 104 to output base section 106. Wire terminals, not shown, can be separately bonded to the input base section and output emitter region contacts. An electrode, also not shown, can be solder bonded to the underside of the chip as a collector contact.

Figure 7:
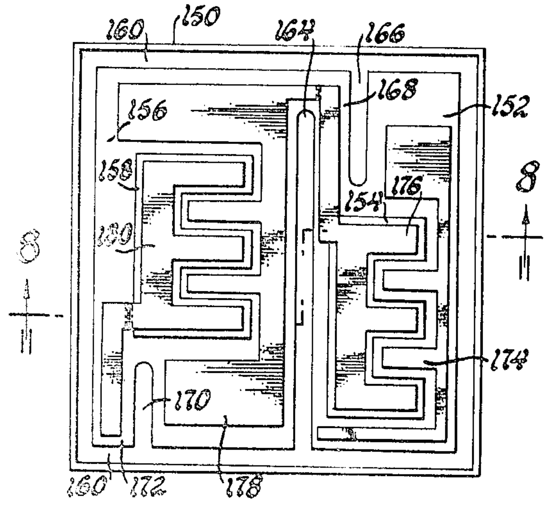
FIG. 7 is a third embodiment of a semiconductor device made in accordance with this invention.
Figure 8:
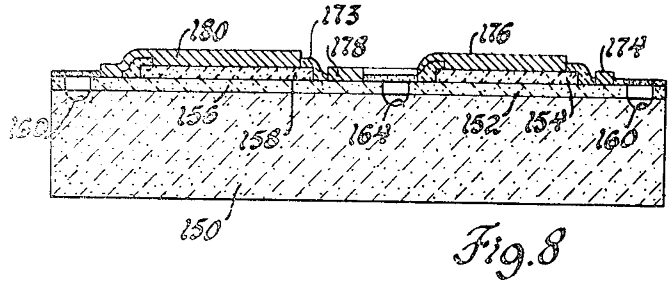
FIG. 8 is a sectional view taken along line 8—8 of FIG. 7.

Referring now primarily to FIGS. 7 and 8, a third embodiment of this invention shows a silicon semiconductor wafer 150 having a generally square major surface which contains interdigitated input and output transistors on opposing ends of the surface. The input transistor includes an input base section 152, and an upstanding generally E-shaped interdigitated emitter mesa 154 thereon. The output transistor includes an output base section 156 and an upstanding generally E-shaped interdigitated output emitter mesa 158 thereon.

An etch moat 160 adjacent the edge of wafer 150 but spaced therefrom by a thin order of base material extends around the perimeter of the major surface of the wafer. A pair of spaced apart generally parallel etch moat extensions 164 and 166 project across the chip from opposite segments of moat 160, resistively isolating the input and output transistors.

Etch moat 164 extends about 90 percent of the distance across the major surface and etch moat 166 extends about 20 percent the distance across the major surface. These etch moats overlap and define an elongated passageway 168 of base material which is contiguous to the output and input base sections on the same side of the wafer. This forms an integral resistive interconnection between input base section 152 and output base section 156.

The second bleeder resistor is formed contiguous to output base section 156 by an etch moat 170 adjacent and generally parallel to one segment of the peripheral moat 160 in a corner of the wafer adjacent the output transistor. Moat 170 and moat 160 cooperate to define a resistive strip 172 of base material contiguous to output base section 156.

A protective refractory coating 173 of silicon oxide is formed over the emitter regions and base sections of the input and output transistors. A widely used passivating substance completely fills the moats and also covers the exposed collector-base PN-junctions. Evaporated aluminum contacts 174 and 176 engage respectively base section 152 and emitter mesa 154 through appropriate openings in the refractory coating. Similarly, evaporated aluminum contacts 178 and 180 respectively engage base section 156 and emitter mesa 158. An evaporated aluminum contact engages the end of resistor strip 172 that is spaced from output base section 156. Over-the-oxide aluminum leads interconnect the input emitter mesa with the output base region and the output emitter mesa with the spaced apart end of resistive strip 172. Wire terminals, not shown, can be separately bonded to the input base section and output emitter region contacts. An electrode can be solder bonded to a major surface of a wafer 150 opposed to the base region.

The semiconductor devices as herein described can be made using the conventional and well-understood vapor deposition, oxide masking, metal evaporation, and photoetch techniques. These techniques, as is widely known, can be easily utilized to manufacture circuit configurations on numerous monolithic semiconductor wafers simultaneously. THe herein recited embodiments can, thusly, be produced in large quantity at low cost using state-of-the art techniques.

It should be understood that although the herein described embodiments each provide a Darlington amplifier circuit, the inventive concepts herein disclosed are not to be so limited. For example, other common circuit configurations can be made in an integrated circuit mesa-type configuration.

Moreover, it should be understood that although the bleeder resistors connected across the base-emitter junctions of the input and output transistors of the preferred embodiment are about 550 ohms and about 187 ohms respectively, the invention is not to be so limited. These resistors should be large enough, however, to avoid draining off too much current when the Darlington amplifier is in a conductive mode. On the other hand, the resistors should not be so large to avoid providing an effective shunt impedance for the leakage current when the Darlington amplifier is in a nonconductive mode. Accordingly, a useful range for the input transistor bleeder resistor for the herein described presently preferred embodiment is about 300 to about 10,000 ohms. However, a useful range for the output bleeder resistor for the herein described preferred embodiment has been found to be about 100 to about 200 ohms.

It should also be understood hat dimensions associated with the semiconductor devices herein described are not to be critically construed and, accordingly, can be altered to fit the particular application. However, the collector substrate thickness in the herein preferred embodiment should not appreciably exceed about 10 mils to avoid introducing excessive collector series resistance. Collector series resistance can, of course, increase the collector-emitter voltage drop. For example, in the herein described presently preferred embodiment, the collector-emitter voltage drop, at about 5 amperes, across the output transistor is less than about 1.5 volts. On the other hand, a chip thickness of less than about 5 mils could be difficult to handle during processing. Likewise, the respective dimensions of the base and emitter regions are generally related to particular characteristics deemed desirable in a particular embodiment. For example, current gain, injection efficiency, and power handling capability can be influenced by dimensional control of these regions as is well understood in the art.

Furthermore, it should be understood that although the resistivity of the collector substrate was herein described in the preferred embodiment as being about 1 ohm centimeter this limitation is not to be strictly construed. The collector resistivity, of course, should be high enough to yield a high breakdown voltage. For example, the herein described embodiment can withstand a collector-emitter voltage of about 200 volts under prescribed conditions. Also, a high-resistivity collector will tend to reduce the capacitance associated with the collector-base junction. On the other hand, a high-resistivity collector will necessarily increase the internal collector resistance. Accordingly, for the herein described presently preferred embodiment, the resistivity of the collector should not be less than about 0.1 ohm centimeter and not more than about 10 ohm centimeter.

We claim:

1. A mesa-type conductor device which comprises a wafer of semiconductor of one said second type having opposed major surfaces, a zone of opposite conductivity type on one of said major surfaces, said zone having first and second sections, a first region of said one conductivity type in said first section, a second region of said one conductivity type in said second section, a first moat means resistively spacing said first section from said second section by defining a passageway of predetermined resistance therebetween, a second moat means cooperating with the periphery of said second section to define a resistive strip of said opposite conductivity-type region having one end thereof contiguous to said second section and a free end spaced therefrom to provide an integral resistance therebetween, contacts separately engaging each of said first and second regions, said sections and said free end of said strip, a first conductor lead interconnecting said first region of said one conductivity type and said section of said opposite conductivity-type zone, a second conductor lead interconnecting said second region of said one conductivity type and said free end of said resistive strip in said second section of said opposite conductivity-type zone.

2. The mesa-type semiconductor device as recited in claim 1 wherein the surface of the wafer has a protective refractory coating thereon isolating the surface of the zone of opposite conductivity type and the surface of the first and second regions of said one conductivity type, the first conductor lead is a conductive coating on said refractory coating overlapping said resistive passageway, and the second conductor is a conductive coating on said refractory coating overlapping said resistive strip.

3. The mesa-type semiconductor device as recited in claim 2 where the first moat means are at least two moat segments substantially parallel to each other.

4. A mesa-type semiconductor device which comprises a body of semiconductor of one conductivity type having opposed major surfaces, a zone of an opposite conductivity type on one of said major surfaces, said zone having integral first and second mesa sections, a first region of said one conductivity type on said first mesa section, a second region of said one conductivity type on said second mesa section, a generally spirallike moat within said zone of opposite conductivity type noncontiguously surrounding said second region and defining an interconnecting resistive passageway between said first and said second mesa sections, a second moat within said zone of opposite conductivity type cooperating with said generally spirallike moat to define a resistive strip of said zone within said second mesa section, said strip having a free end contiguous said first moat, an oxide coating on the surface of said zone of opposite conductivity type and the surfaces of said first and second regions, contacts separately engaging each of said first and second regions, said mesa sections and said free end of said strip, a first conductor interconnecting said first region and said second mesa section, said first conductor generally overlying said resistive passageway on said oxide coating, a second conductor generally overlying said oxide coating on said resistive strip and interconnecting said second region and said free end of said resistive strip.

5. The mesa-type semiconductor device as recited in claim 4 wherein the body of semiconductor has a resistivity of about 0.1 ohm centimeter to about 10 ohm centimeter, and the sheet resistivity of the layer is about 10 ohms per square to about 200 ohms per square.

6. A mesa-type Darlington amplifier which comprises an N-type collector substrate, having opposed major surfaces, a P-type base region on one of said major surfaces, said base region having integral input and output base sections, an N-type input emitter mesa region on said input base section, an N-type output emitter mesa region on said output base section, a discontinuous generally rectangularlike etch moat noncontiguously surrounding said output emitter region in spiral like fashion and having generally parallel overlapping end segments, said overlapping end segments defining an elongated passageway of said base region therebetween, said passageway integrally spacing said input base section from said output base section providing an integrally formed predetermined resistance therebetween, a second moat extending generally perpendicular from one side of said rectangularlike moat toward said output emitter region terminating adjacent said output base region, said second moat cooperating with said rectangularlike moat defining an elongated strip of said base region, said strip having one end contiguous to said output base section and a free end spaced therefrom, evaporated aluminum contacts separately engaging said base sections and said emitter regions and said free end of said elongated strip, a protective refractory oxide coating on the surfaces of said base region and said emitter mesa regions, a first over-the-oxide conductor lead interconnecting said input emitter mesa region and said output base section, said first lead generally overlying said passageway in said oxide coating, a second over-the-oxide conductor lead generally overlying said elongated strip on said oxide coating interconnecting said output emitter mesa region and said free end of said strip, a collector electrode on a surface of said collector substrate spaced from said base region, wire terminals separately bonded to the contacts on said input base section and said output emitter mesa region.

7. A mesa-type Darlington amplifier having bleeder resistors integrally formed on a monolithic semiconductor wafer comprising a NPN input transistor formed generally about the periphery of the semiconductor chip, an NPN output transistor formed generally on the central portion of the chip, a generally rectangularlike discontinuous etch moat noncontiguously surrounding the base and emitter mesa regions of the input transistor in a mazelike fashion, a resistive passageway of semiconductor integrally formed between the ends of said rectangularlike moat resistively interconnecting the bases of the input and output transistors, a second moat cooperating with said rectangularlike moat to form an elongated strip of semiconductor having one end contiguous to the base of the output transistor and a free end spaced therefrom providing a resistance integrally connected to the base of the output transistor, evaporated aluminum contacts separately engaging the base and the emitters of both the input and the output transistors, means for electrically interconnecting the emitter of the input transistor to the base of the output transistor and the emitter of the output transistor to the remote end of said strip.

8. A mesa-type semiconductor device which comprises a wafer of semiconductor of one conductivity type having opposed major surfaces a region of semiconductor of an opposite conductivity type on one of said major surfaces, said region having integral first and second sections, a first mesa region of said one conductivity type on said first section, a second mesa region of said one conductivity type on said second section, a pair of generally parallel moats projecting from opposing sides of said region of an opposite conductivity type extending substantially across said region of a second conductivity type and terminating adjacent opposite sides thereof defining a passageway of said region of a second conductivity type therebetween resistively interconnecting said first and second sections, a third moat within said region of an opposite conductivity type cooperating with the periphery of said second section to define a strip of said region of an opposite conductivity type having one end contiguous to said second section and a free end, a protective refractory coating on the surface of said region of opposite conductivity and the surfaces of said mesa regions, contacts separately engaging each of said first and second regions, said sections and said free end of said strip, a first conductor interconnecting said second mesa region and said first section, a second conductor interconnecting said first mesa region and said free end of said strip providing an integral resistance therebetween, said first conductor generally overlies the passageway on said protective coating, and said second conductor generally overlies the strip on said protective coating.

9. A mesa-type semiconductor device which comprises a wafer of semiconductor of one conductivity type having opposed major surfaces, a region of semiconductor of an opposite conductivity type on one of said major surfaces, said region having first and second sections, a first mesa region of said one conductivity type on said first section and interdigited therewith, a second mesa region of said first conductivity type on said second and interdigited therewith, a peripheral moat within said region of a second conductivity type and extending about the periphery of said region, second and third moat extensions each projecting from an opposing side of said first moat across said region of an opposite conductivity type, said second and third moat extensions terminating on the same side of said region of an opposite conductivity type defining a passageway of said region of an opposite conductivity type therebetween, a fourth moat extension within said second section cooperating with said peripheral moat to define a resistive strip of said region of an opposite conductivity type having an end contiguous to said second section and a free end, a protective refractory coating on the surface of said region of an opposite conductivity type and the surface of said mesa regions, interdigited contacts separately engaging each of said first and second mesa regions and said sections and a contact engaging said free end of said strip, a first conductor interconnecting said interdigitated second mesa region and said first section, a second conductor interconnecting said first mesa region and said remote end of said strip providing integral resistance therebetween said first conductor generally overlying said passageway on said protective coating, and said second conductor generally overlies the resistive strip on said coating.

* * * * *

PO-1050
(5/69)

UNITED STATES PATENT OFFICE
CERTIFICATE OF CORRECTION

Patent No. 3,624,454 Dated November 30, 1971

Inventor(s) Allen R. Adkinson, Richard G. Carter and Glen E. Harland, Jr.

It is certified that error appears in the above-identified patent and that said Letters Patent are hereby corrected as shown below:

Column 3, line 4, "chip both emitter mesas" should read -- of both emitter mesas --.

Column 3, line 7, "free end 51" should read -- free end at 51 --.

Column 4, line 9, "in the 32" should read -- passageway 32 --.

Column 4, line 70, "thin order of" should read -- thin border of --.

Column 6, line 25, "of one said second type" should read -- of one conductivity type --.

Column 6, line 50, "coating overlapping" should read -- coating overlying --.

Column 6, line 52, "coating overlapping" should read -- coating overlying --.

Column 8, line 37, "having first and second" should read -- having integral first and second --.

Signed and sealed this 23rd day of May 1972.

(SEAL)
Attest:

EDWARD M.FLETCHER,JR.
Attesting Officer

ROBERT GOTTSCHALK
Commissioner of Patents